United States Patent
Richter et al.

(10) Patent No.: US 7,763,507 B2
(45) Date of Patent: Jul. 27, 2010

(54) STRESSED INTERLAYER DIELECTRIC WITH REDUCED PROBABILITY FOR VOID GENERATION IN A SEMICONDUCTOR DEVICE BY USING AN INTERMEDIATE ETCH CONTROL LAYER OF INCREASED THICKNESS

(75) Inventors: Ralf Richter, Dresden (DE); Thorsten Kammler, Ottendorf-Okrilla (DE); Heike Salz, Dresden (DE); Volker Grimm, Langebrueck (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 72 days.

(21) Appl. No.: 12/135,478

(22) Filed: Jun. 9, 2008

(65) Prior Publication Data
US 2009/0140396 A1 Jun. 4, 2009

(30) Foreign Application Priority Data
Nov. 30, 2007 (DE) .................. 10 2007 057 688

(51) Int. Cl.
*H01L 21/336* (2006.01)
*H01L 21/31* (2006.01)

(52) U.S. Cl. .................. 438/197; 438/283; 438/694; 438/761; 257/E21.249; 257/E21.409

(58) Field of Classification Search .................. 438/157, 438/197, 199, 283, 694, 761, 763; 257/E21.24, 257/E21.409, E21.487
See application file for complete search history.

(56) References Cited

U.S. PATENT DOCUMENTS

| | | | |
|---|---|---|---|
| 2006/0046350 A1* | 3/2006 | Jiang et al. | 438/114 |
| 2006/0113641 A1* | 6/2006 | Hohage et al. | 257/640 |
| 2006/0189051 A1 | 8/2006 | Kim | 438/154 |
| 2007/0196972 A1* | 8/2007 | Shima | 438/197 |

FOREIGN PATENT DOCUMENTS

DE 10 2004 057 762 A1 6/2006
DE 10 2004 031 744 A1 7/2006

OTHER PUBLICATIONS

Widmann et al., Technologie hochintegrierter Schaltungen, $2^{nd}$ edition, pp. 182-187, 1996.
Translation of Official Communication from German Patent Office for German Patent Application No. 10 2007 057 688.0-33 dated Aug. 14, 2008.

* cited by examiner

*Primary Examiner*—Tuan N. Quach
(74) *Attorney, Agent, or Firm*—Williams, Morgan & Amerson, P.C.

(57) ABSTRACT

By forming an etch control material with increased thickness on a first stressed dielectric layer in a dual stress liner approach, the surface topography may be smoothed prior to the deposition of the second stressed dielectric material, thereby allowing the deposition of an increased amount of stressed material while not contributing to yield loss caused by deposition-related defects.

15 Claims, 7 Drawing Sheets

STRESSED INTERLAYER DIELECTRIC WITH REDUCED PROBABILITY FOR VOID GENERATION IN A SEMICONDUCTOR DEVICE BY USING AN INTERMEDIATE ETCH CONTROL LAYER OF INCREASED THICKNESS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

Figure 1A:
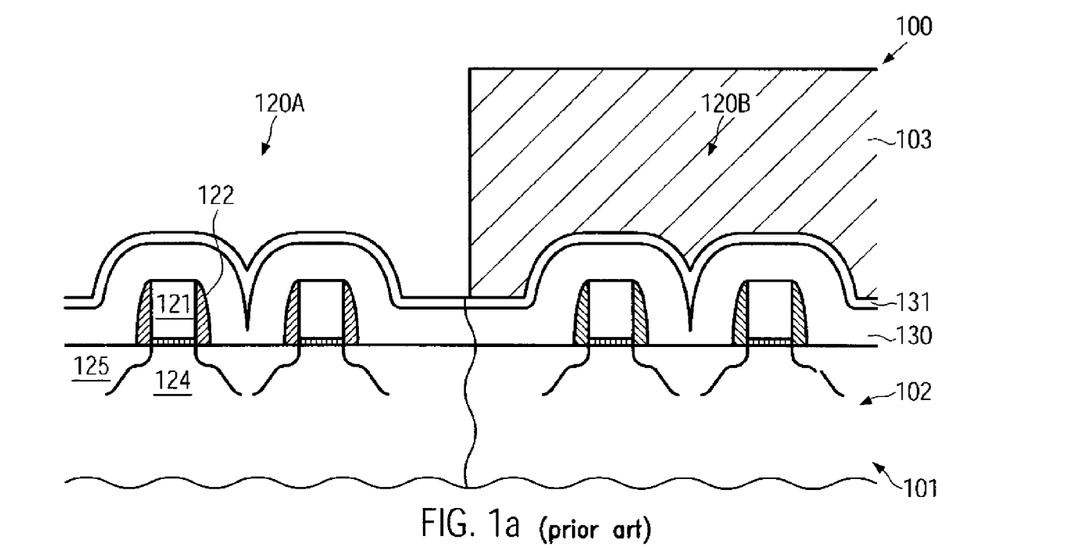
FIGS. 1a-1c schematically illustrate cross-sectional views of a semiconductor device during various manufacturing stages in forming differently stressed contact etch stop layers, wherein the semiconductor device includes densely spaced transistor elements, according to conventional techniques.
Figure 1B:
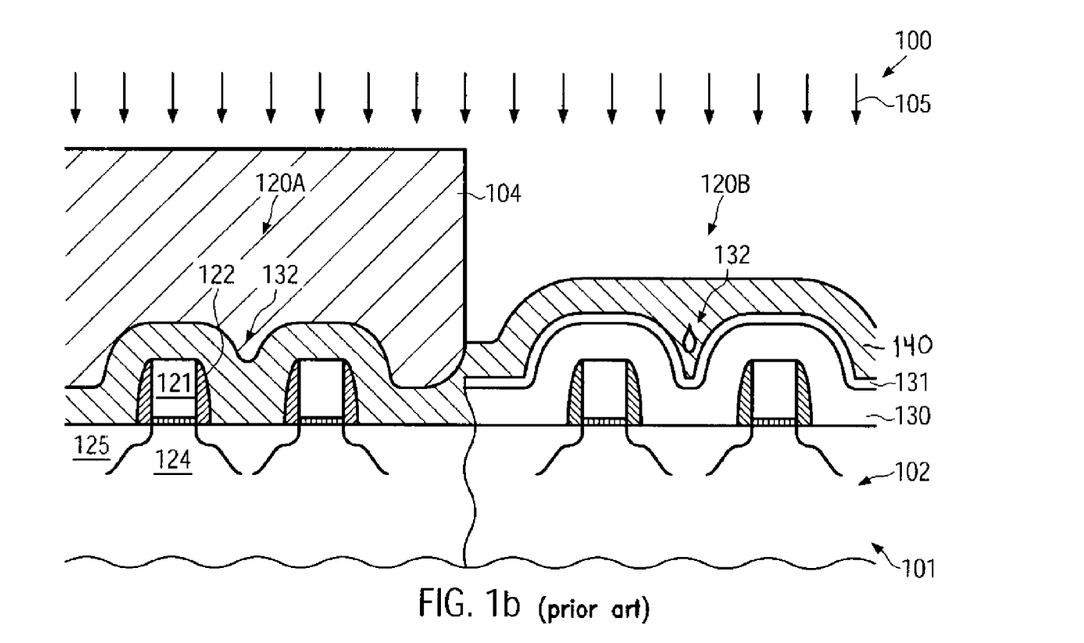
Figure 1C:
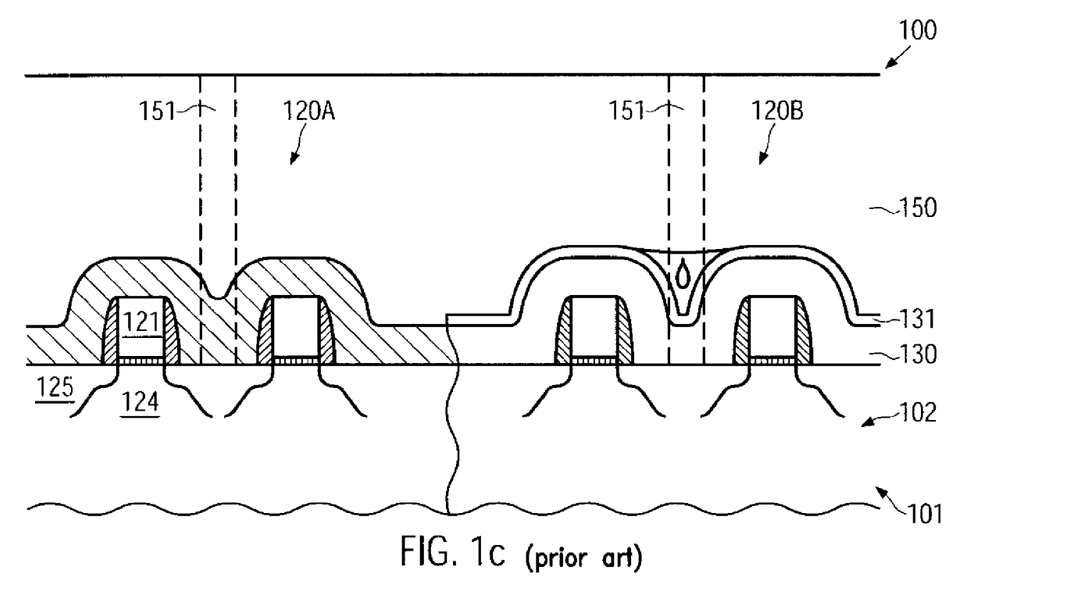

During the formation of the two types of stressed layers, conventional techniques may suffer from reduced efficiency when device dimensions are increasingly scaled by using the 45 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIG. 1a-1c.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a, the horizontal extension of the gate electrode 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising, for instance, a high intrinsic tensile stress is formed above the first and second device areas 120A, 120B, followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B. The etch indicator layer 131 is typically provided with a thickness that is sufficient to stop an etch process in a later stage when patterning the layer 130, or to provide a pronounced endpoint detection signal. That is, a silicon nitride etch chemistry reacting with silicon dioxide results in a specific plasma atmosphere, which can be detected by standard detection techniques. Usually, a thickness of the etch indicator layer 131 is selected to be approximately 10-20 nm, thereby providing sufficient etch stop capabilities across the substrate in order to reliably control the respective etch process. In some approaches, the etch indicator layer 131 may act as a hard mask during the patterning of the silicon nitride layer 130.

As is evident from FIG. 1a, due to the reduced spacing between neighboring transistor elements, the silicon nitride layer 130 may have to be deposited with a moderately low thickness to take into consideration the gap fill capabilities of the deposition process, since when the spacing between the transistor elements may be on the order of two times a layer thickness of the silicon nitride layer 130, the limited conformal fill behavior may result in corresponding defects, such as voids.

Furthermore, in this manufacturing stage, the semiconductor device 100 may comprise a resist mask 103 exposing the first device area 120A, while covering the second device region 120B. In this case, it may be assumed that the intrinsic stress of the silicon nitride layer 130 may be appropriately selected to enhance the transistor performance in the second device area 120B.

A typical process flow for forming the semiconductor device 100 as shown in FIG. 1a may comprise the following processes. The gate electrodes 121 and the gate insulation layers may be formed and patterned on the basis of well-established process techniques, including advanced photolithography, deposition, oxidation and etch techniques. Thereafter, the drain and source regions 125 may be formed in combination with the sidewall spacer structures 122 on the basis of well-established deposition processes, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa) and even more of compressive stress, or up to 1 GPa or even significantly higher of tensile stress, may be created to enhance the performance of the transistor in the first device area 120A. Due to the less pronounced conformality of the silicon nitride deposition process above a certain layer thickness and for increased aspect ratios, as may occur in highly scaled devices, caused by the reduced distance between the neighboring transistor elements at moderately dimensioned gate heights in densely packed device areas, as shown, the thickness of the silicon nitride material is selected so as to avoid irregularities, such as voids, thereby, however, sacrificing additional gain in performance in the device region 120B. That is, due to the reduced layer thickness adapted to the spacing between the transistors, the amount of highly stressed material is restricted and hence also the finally achieved stress created by the silicon nitride layer 130 in the region 120B. Thus, the deposition process for the silicon dioxide layer 131 may encounter an even more pronounced surface topography, wherein, however, highly conformal deposition processes may be available for silicon dioxide material to enable a void-free deposition.

After the deposition of the silicon dioxide layer 131, the resist mask 103 may be formed on the basis of well-established photolithography techniques. Next, an appropriately designed etch process may be performed in order to remove a portion of the layers 130 and 131 from the device area 120A. During the corresponding etch process, the silicon dioxide material of the layer 131 may be removed first followed by a selective etch process for removing the material of the silicon nitride layer 130, wherein the corresponding etch process may be controlled on the basis of an etch stop layer, if required.

FIG. 1b schematically illustrates the semiconductor device 100 at a further advanced manufacturing stage. As shown, a second dielectric layer 140 may be formed above the first and second device areas 120A, 120B, wherein a void 132 may be present in the second device area 120B due to the limited gap filling capability of the deposition process for forming a highly stressed silicon nitride material and the pronounced surface topography previously created during the deposition of the layers 130, 131. The void 132 in the second device region 120B may result in a reduced stress transfer mechanism, as well as degraded etch uniformity during the subsequent processing. Furthermore, at the manufacturing stage shown in FIG. 1b, a corresponding resist mask 104 is provided to protect the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role during the etch process 105, since, in combination with the surface topography generated during the deposition of the layers 130 and 131, a substantially complete removal of the exposed portion of the layer 140 may depend on the deposition capabilities of the subsequent deposition for a given device geometry. Due to the creation of the void 132, the thickness of the layer 140 may be increased in the vicinity of the void, which may result in a non-sufficient removal of the material of the layer 140 during the process 105. Thus, the void 132 may be maintained after the process 105, thereby causing yield loss during the further processing due to contact failures.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS and the like, which may be followed by respective planarization processes, if required. Thereafter, respective contact openings 151 may be formed, which may, in some cases, for instance in dense RAM regions, connect to the device layer at areas located between respective closely spaced transistors. Thus, the corresponding void 132 may also affect the corresponding process, thereby resulting in less reliable contacts or even total contact failures.

As a consequence, upon further device scaling, the respective limitation of deposition processes for dielectric materials of high intrinsic stress may require a significant reduction of the layer thickness of the stress-inducing layers to comply with increased aspect ratios encountered in advanced device geometries. However, in this case, the respective strain induced by the stressed dielectric materials may also be significantly reduced, thereby also reducing transistor performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of reduced efficiency of strain-inducing mechanisms in highly scaled transistor elements and/or of respective non-uniformities during the patterning of contact openings by providing a technique in which the surface topography after the deposition of a first stress-inducing layer is smoothed by forming a material layer with an appropriate thickness so that, in combination with the previously deposited stress-inducing material, spaces between densely packed gate electrode structures may be reliably filled to a certain height level that ensures a less critical deposition of a subsequent highly stressed material. Therefore, the creation of voids in the subsequently deposited stressed material and any material residues associated with the created irregularities may be reduced, thereby contributing to reduced yield loss. The material may be deposited by an appropriate deposition technique that may provide enhanced gap fill capabilities compared to the PECVD techniques typically used for the deposition of the stress-inducing layers. Hence, the stress-inducing layer may be deposited according to constraints as imposed by the surface geometry and the deposition behavior of the deposition technique used, thereby enabling the deposition of an increased amount of stressed material, since the further material having the enhanced gap fill behavior may reliably provide an improved, that is less pronounced, surface topography for depositing the subsequent stress-inducing layer of different intrinsic stress. In this way, the applicability of dual stress liner approaches may be extended to device generations comprising transistor elements having a gate length of 50 nm and less.

One illustrative embodiment disclosed herein comprises conformally depositing a first stress-inducing dielectric layer above a first plurality of gate electrode structures and a second plurality of gate electrode structures of a semiconductor device, wherein the first and second gate electrode structures are at least partially formed above a semiconductor layer. The method further comprises forming an etch control layer on the first stress-inducing layer so as to obtain a specified fill height of the first stress-inducing layer and the etch control layer in a space between adjacent two of the gate electrode structures, wherein the specified fill height corresponds to at least one half of a height of the first and second pluralities of gate electrode structures. Moreover, the etch control layer and the first stress-inducing layer are selectively removed from the second plurality of gate electrode structures. Then, a second stress-inducing dielectric layer is deposited above the etch control layer and the first stress-inducing layer and the second plurality of gate electrode structures. Finally, the method comprises selectively removing the second stress-inducing layer from above the first stress-inducing layer by performing an etch process and using the etch control layer as an etch stop.

A further illustrative method disclosed herein comprises depositing a first stress-inducing dielectric layer above a plurality of gate electrode structures, wherein the plurality of gate electrode structures are at least partially formed above a semiconductor layer. The further method comprises depositing one or more material layers so as to fill spaces between adjacent ones of the plurality of gate electrode structures up to a height level that approximately corresponds to one half or more of a height of the plurality of gate electrode structures. Furthermore, the one or more material layers and the first stress-inducing layer are selectively removed from above a second subset of the plurality of gate electrode structures while maintaining the one or more material layers and the first stress-inducing layer above a first subset of the plurality of gate electrode structures. Additionally, a second stress-inducing layer is formed above the first and second subsets of gate electrode structures. Finally, the method comprises selectively removing the second stress-inducing layer from above the first subset by performing a removal process and using the one or more material layers for controlling the removal process.

One illustrative semiconductor device disclosed herein comprises a first gate electrode structure of a first transistor and a second gate electrode structure of a second transistor. The semiconductor device further comprises a first dielectric layer formed above the first transistor and the second transistor, wherein the first dielectric layer induces a first type of strain in the first and second transistors. An etch stop layer is formed on the first stress-inducing layer, wherein the etch stop layer and the first stress-inducing layer fill a space between the first and second gate electrode structures up to a specified height level that approximately corresponds to one half or more of a height of the first and second gate electrode structures. Additionally, the semiconductor device comprises an interlayer dielectric material formed on the etch stop layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
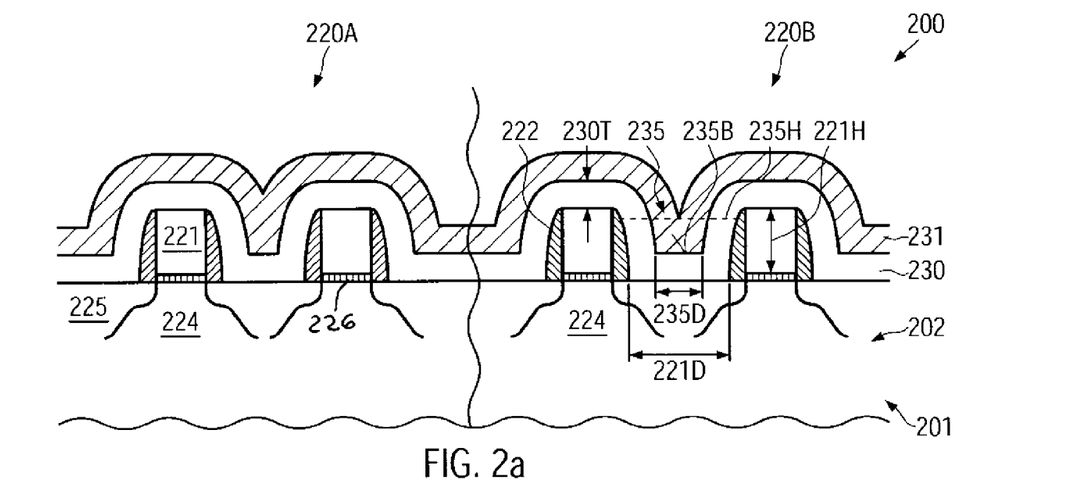
FIGS. 2a-2e schematically illustrate cross-sectional views of a semiconductor device including different device regions, in which transistor elements receive differently stressed dielectric materials, one of which may be deposited on the basis of a less pronounced surface topography due to the previous deposition of an etch control material with increased thickness, according to illustrative embodiments.

FIG. 2a schematically illustrates a cross-sectional view of a semiconductor device 200, which may comprise a substrate 201 above which is formed a semiconductor layer 202. In the semiconductor layer 202, a first device region 220A and a second device region 220B may be provided in which a plurality of transistor elements may be formed. For convenience, the plurality of transistor elements may also be denoted by reference signs 220A, 220B, when appropriate. Each of the transistor elements in the first and the second device regions 220A, 220B may comprise a gate electrode structure 221 including a gate insulation layer 226 and a sidewall spacer structure 222, which, in some illustrative embodiments, may also be removed, partially or completely, in this manufacturing stage, depending on the overall process strategy. Furthermore, each of the transistors in the first and the second device regions 220A, 220B may comprise a channel region 224 and respective drain and source regions 225. With respect to the components of the semiconductor device 200 described so far, the same criteria apply as previously explained with reference to the semiconductor device 100.

Furthermore, in the manufacturing stage shown, a first dielectric stress-inducing layer 230 is formed above the first and second device regions 220A, 220B with a thickness 230T that is appropriately selected with respect to the overall device geometry of the semiconductor device 200. That is, in some illustrative embodiments, the stress-inducing layer 230 may be provided in a highly conformal state so that the thickness 230T may have approximately the same value in horizontal and vertical portions of the semiconductor device 200. For example, the thickness 230T may range from approximately 20-80 nm, depending on the configuration of the device 200. In the embodiment shown, the first and second device regions 220A, 220B may represent densely packed device areas, in which the gate electrode structures 221 may have a gate length of approximately 50 nm and significantly less, such as 30 nm and less, so that a corresponding distance between adjacent gate electrode structures 221, indicated as 221D, may be in the range of 100 nm and less, thereby imposing restrictive constraints on the deposition behavior of the corresponding deposition process for forming the stress-inducing layer 230, as previously explained. In some illustrative embodiments, the thickness 230T is selected such that a gap 235 may be defined by the layer 230 in the space 221D such that the thickness 230T may be, at most, one half of the spacing 221D in order to avoid a merging of the respective layer portions, which may otherwise contribute to a high probability for creating voids between adjacent gate electrode structures 221. Thus, in some illustrative aspects, the gap 235 may be obtained such that a substantially horizontally oriented bottom portion 235B may be defined by the layer 230, thereby providing enhanced deposition conditions for the subsequent deposition of an etch control layer 231, which may be comprised of silicon dioxide and the like.

The etch control layer 231, contrary to conventional strategies, may be provided with increased thickness in the range of approximately 20 nm or more in order to reliably fill the gap 235 up to a specified height level 235H, which corresponds at least to half of a height 221H of the gate electrode structures 221, wherein, in some illustrative embodiments, the height level 235H is comparable to the height 221H, while, in other cases, the height level 235H extends above the height 221H, as will be described later on in more detail.

Consequently, by providing the etch control layer 231 with an appropriate thickness or by using a non-conformal deposition technique, the gap 235 may be filled up to the height level 235H, thereby smoothing the resulting surface topography for a subsequent deposition process.

A typical process flow for forming the semiconductor device 200 as shown in FIG. 2a may comprise substantially the same process steps as previously described with reference to the device 100 for forming the respective transistor elements in the device regions 120A, 120B. Thereafter, an optional etch stop layer (not shown) may be deposited, for instance, in the form of a silicon dioxide layer and the like, followed by the deposition of the stress-inducing layer 230 on the basis of appropriately selected deposition parameters in order to obtain the thickness 230T and the desired conformal deposition behavior, while, on the other hand, providing a desired amount of highly stressed material in the vicinity of the transistor elements in the regions 220A, 220B. It should be appreciated that, due to the fact that a topography smoothing effect may be accomplished by the increased thickness of the etch control layer 231, typically an increased value for the layer thickness 230T may be selected, compared to conventional strategies for the same technology, without increasing the probability of creating any defects, as is, for instance, described with reference to the device 100.

Thereafter, the etch control layer 231 may be deposited, for instance, by thermally activated chemical vapor deposition (CVD) techniques, such as sub-atmospheric chemical vapor deposition (SACVD), which may enable a highly conformal deposition behavior, if desired, while at the same time providing enhanced gap fill capabilities compared to, for instance, the plasma enhanced chemical vapor deposition (PECVD) techniques for forming the highly stressed layer 230. In other illustrative embodiments, any other deposition technique, such as PECVD for the deposition of silicon dioxide-based materials, may be used, wherein, however, a thickness may be selected such that, in combination with the thickness 230T, the height level 235H may be obtained. For example, in the embodiment shown in FIG. 2a, the deposition characteristic of the respective process technique may be a substantially conformal deposition behavior for the layer 231, thereby requiring a thickness that is at least half of the distance 235D so as to obtain a reliable filling of the gap 235 without leaving narrow gaps and the like. Moreover, in the respective deposition process, the overhangs and, thus, voids may be substantially avoided during the formation of the layer 231.

Figure 2B:
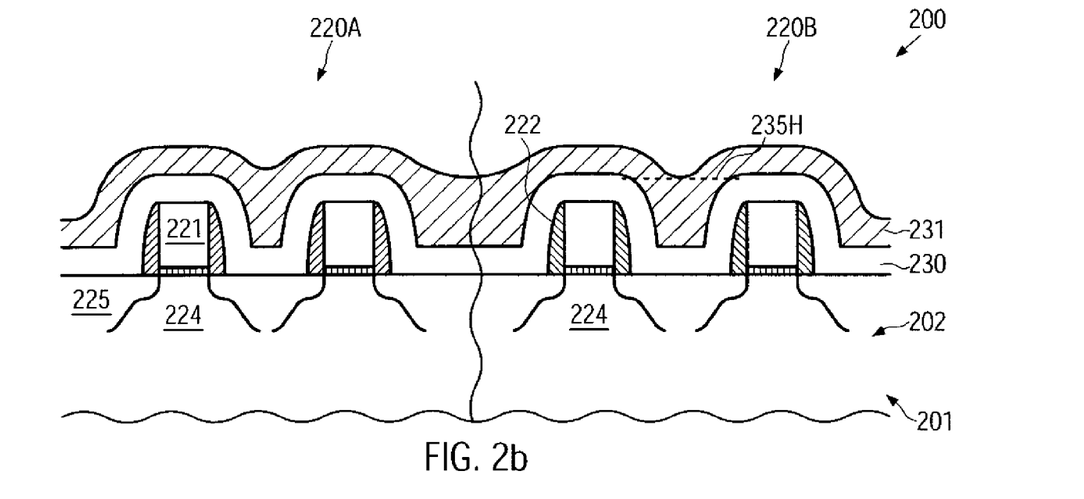

FIG. 2b schematically illustrates the semiconductor device 200 according to further illustrative embodiments in which the etch control layer 231 may be deposited on the basis of a deposition process providing a non-conformal deposition behavior. For example, as previously explained, thermally activated CVD processes on the basis of, for instance, TEOS (tetraethylorthosilicate) may be used for moderately high process pressures of approximately 200-700 Torr, thereby obtaining a substantially flow-like deposition behavior. In other embodiments, the etch control material 231 may be provided by spin-coating techniques on the basis of any appropriate material, such as polymer materials, that may be applied in the low viscous state and may be subsequently treated, for instance, by heat, radiation and the like, in order to harden the material so as to exhibit the desired characteristics with respect to the mechanical and chemical behavior. As shown, also, in this case, the gap 235 may be reliably filled up to the desired height level 235H, which may be positioned above the height level of the gate electrode structures 221, depending on the deposition characteristics, i.e., the viscosity and the desired amount of layer thickness to be provided above the gate electrode structures 221. Thus, due to the enhanced gap-filling capability of the illustrated deposition process, the thickness 230T of the stress-inducing layer 230 may be selected such that the width 235D of the gap 235 may be reduced, as long as a substantially conformal deposition behavior of the layer 230 in the space 221 may be accomplished. Thus, also in this case, a significant smoothing of the previously created surface topography may be accomplished, thereby efficiently relaxing any requirements with respect to gap-filling capabilities of a subsequent deposition process.

Figure 2C:
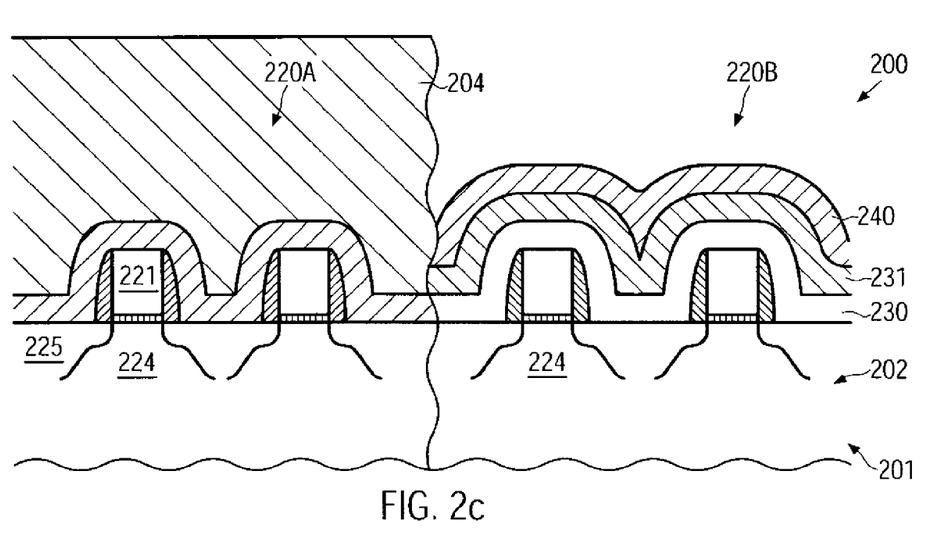

FIG. 2c schematically illustrates the semiconductor device 200 in a further advanced manufacturing stage, in which a portion of the layers 230, 231 is removed above the device region 220A. Furthermore, a second stress-inducing layer 240 is formed above the device region 220A and above the remaining portions of the layer 230, 231 in the device region 220A. Furthermore, in the manufacturing stage shown, an etch mask, such as a resist mask 204, may be provided to cover the device region 220A, while exposing the device region 220B. The device 200 as shown in FIG. 2c may be formed on the basis of substantially the same process techniques as previously described wherein, however, the thickness of the layer 240 may be selected on the basis of the deposition capabilities of the deposition process under consideration and with respect to the device geometry as provided in the region 220B, since the surface topography of the region 220B is less pronounced due to the provision of the etch control layer 231 having the increased thickness. Thus, contrary to conventional strategies, the thickness of the layer 240 and also the thickness of the layer 230 may be selected on the basis of the initial device geometry and the deposition capabilities rather than with respect to a pronounced surface topography that results in conventional techniques after the deposition of the first stress-inducing layer followed by the deposition of a moderately thin control layer, as previously explained. Consequently, the enhanced performance for the transistor elements in the regions 220A, 220B may be accomplished without additionally contributing to deposition irregularities, which may conventionally result in increased yield loss.

Thereafter, an etch process may be performed on the basis of well-established recipes, wherein the enhanced thickness of the etch control layer 231 provides superior etch stop characteristics and/or etch indicator characteristics, as previously explained. Consequently, the exposed portion of the layer 240 above the device region 220B may be reliably removed without substantially contributing to unwanted material removal of the layer 230 due to the increased thickness of the etch control layer 231. Thereafter, the etch mask 204 may be removed and the further processing may be continued by the deposition of an appropriate interlayer dielectric material, such as silicon dioxide and the like.

Figure 2D:
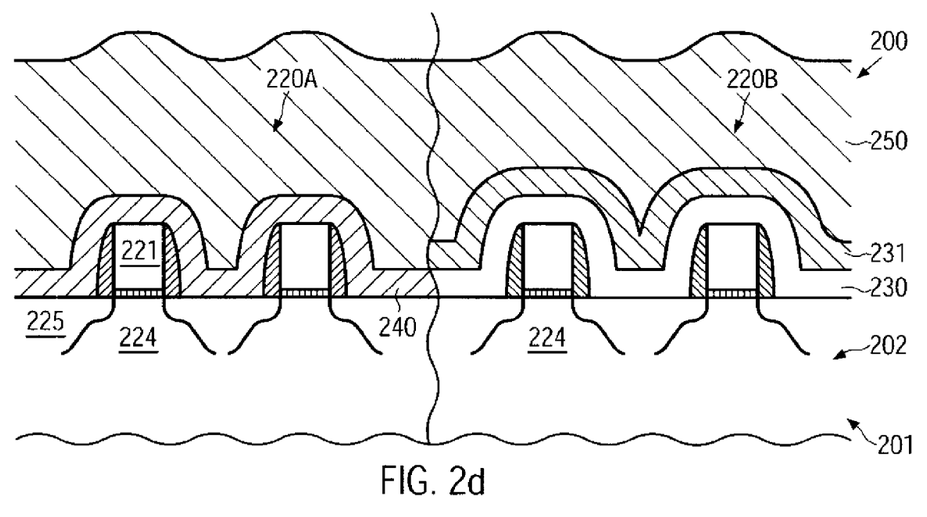

FIG. 2d schematically illustrates the semiconductor device 200 after the above-described process sequence. That is, the device 200 may comprise an interlayer dielectric material 250, for instance, in the form of silicon dioxide or any other appropriate material composition. The layer 250 may be formed on the basis of plasma enhanced CVD, thermally activated CVD and the like. Thereafter, the further processing may be continued, for instance, by planarizing the surface topography and forming respective contact openings, as is also previously described with reference to the device 100.

Figure 2E:
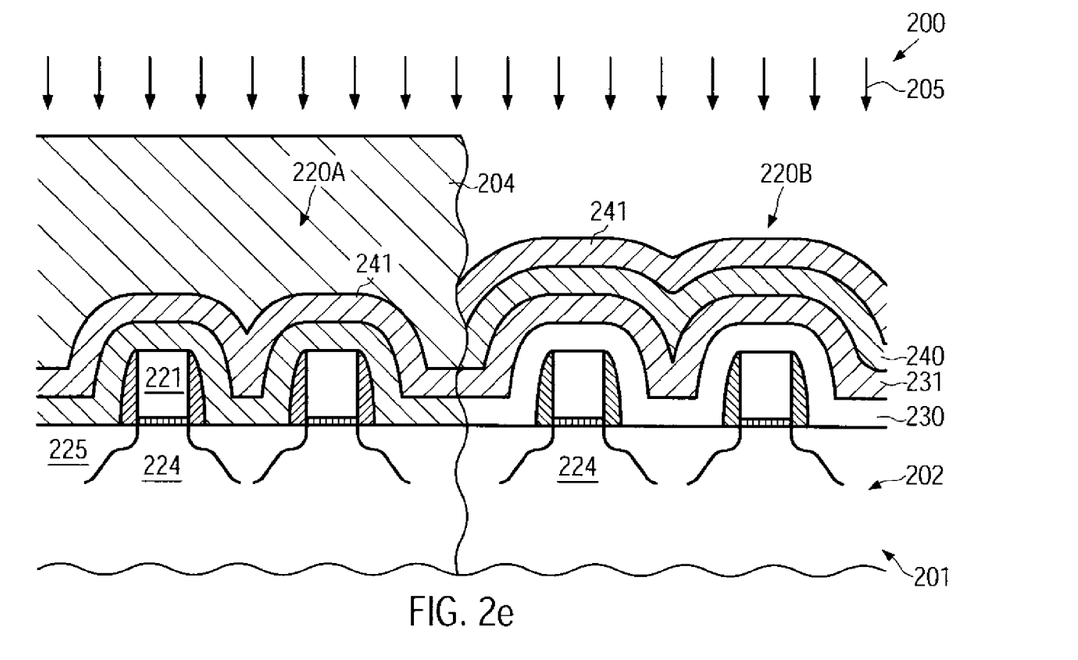

FIG. 2e schematically illustrates the semiconductor device 200 according to further illustrative embodiments. As shown, after the removal of the layers 230, 231 from the device region 220A, the layer 240 may have been deposited, as previously described. Thereafter, a further fill material 241 may be deposited, for instance, on the basis of respective deposition techniques, as previously described with reference to the etch control layer 231. Hence, the surface topography in the region 220A may also be smoothed by the provision of the material 241, which may result in a more uniform process behavior during the subsequent processing of the device 200, for instance, with respect to deposition of an interlayer dielectric material, or with respect to the patterning of the interlayer dielectric material for forming contact openings. Thus, after the deposition of the additional fill material 241, which in one illustrative embodiment may be accomplished on the basis of substantially the same process parameters as may have been used for depositing the layer 231, the etch mask 204 may be formed and subsequently an appropriately designed etch process 205 may be performed to first remove the exposed portion of the fill material 241 and subsequently remove the portion 240, while using the layer 231 as an efficient etch stop. Consequently, after the etch process 205, a similar device configuration may be obtained in the device regions 220A, 220B, except for any differences created by etch damage during the process 205 in the layer 231 and any differences caused by the different internal stress levels of the layers 230, 240. Hence, the further processing may be continued on the basis of highly "symmetrical" conditions. Furthermore, due to the less pronounced surface topography in the region 220B, enhanced flexibility in selecting process parameters for the deposition of a subsequent material layer may be provided, since now both device regions 220A, 220B may have substantially the same surface topography.

Consequently, by providing the etch control layer 231 with increased thickness, increased efficiency of the respective strain-inducing mechanisms provided by the layers 230, 240 may be enhanced, since an increased amount of stress-inducing material may be positioned close to the respective channel regions 224, while not contributing to increased failure mechanisms, such as the creation of voids in the second stressed dielectric material, as previously explained.

With reference to FIGS. 3a-3d, further illustrative embodiments will now be described, in which a fill material may be provided prior to the deposition of a second stress-inducing layer in order to enhance the deposition characteristics and also provide the possibility of reducing the number of lithography steps required.

Figure 3A:
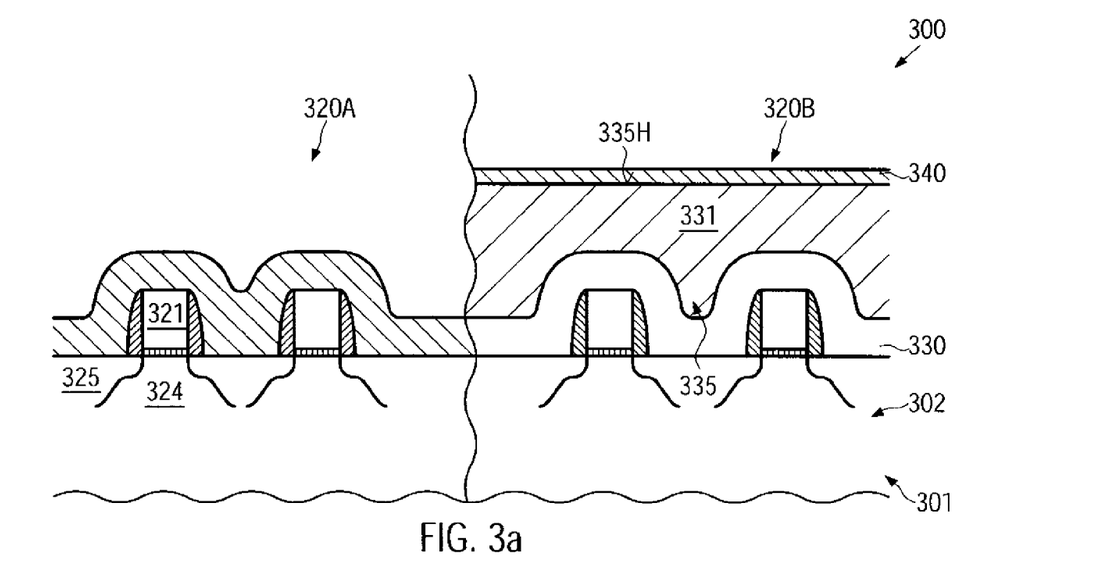
FIGS. 3a-3d schematically illustrative cross-sectional views of a semiconductor device receiving differently stressed materials, wherein the second stressed material may be deposited on the basis of a less pronounced surface topography, while, also, selectively removing unwanted portions of less stressed material may be accomplished with a reduced number of lithography steps, according to further illustrative embodiments.

FIG. 3a schematically illustrates a cross-sectional view of a semiconductor device 300, which may comprise device regions 320A, 320B formed above a semiconductor layer 302, which is provided above a substrate 301. The device regions 320A, 320B may comprise a plurality of circuit elements, such as transistors, including gate electrode structures 321, which may have the same configuration as previously explained with reference to the devices 100 and 200. Hence, the respective components may be denoted by the same reference numerals except for a first "3" instead of "2" or "1" and any detailed description thereof will be omitted.

The device 300 may further comprise a first stress-inducing layer 330 in the first device region 320B, wherein the stress-inducing layer 330 may have the same configuration as previously described with reference to the layer 230. Furthermore, a fill material 331 may be provided so that a gap 335 defined by the layer 330 between adjacent gate electrode structures 321 may be filled to a height level that extends above the height of the gate electrode structures 321, as indicated by 335H. In some illustrative embodiments, an etch stop layer 332 (FIG. 3d) may be provided in a highly conformal manner with a thickness that provides sufficient integrity of the layer 330 during an etch process, when removal of the fill material 331 may be desired. Moreover, the device 300 may comprise a second stress-inducing layer 340 in the device region 320B and also in the region 320A, that is, on the fill material 331. The device 300 as shown in FIG. 3a may be formed on the basis of substantially the same process techniques as previously described with reference to the device 200, except for forming the layers 332 and 331. For this purpose, after the deposition of the layer 330, the layer 332 may be formed, if provided, for instance on the basis of any appropriate conformal deposition technique. In other cases, a more or less non-conformal deposition technique may be used, as long as the creation of any voids in the gap 335 may be substantially avoided. Thereafter the fill material 331 may be formed, for instance by spin-on techniques or any other appropriate non-conformal deposition technique, wherein, as shown, a certain excess height may be provided so as to reliably enclose the gate electrode structures 321. For example, appropriate polymer materials may be used and may be provided with a sufficient excess height, wherein, in some cases, a planarization step may be used, if deemed appropriate. Thereafter, the respective etch process may be performed to remove the layers 330, 332 (if provided) and 331 from above the device region 320A. Next, the stress-inducing layer 340 may be deposited on the basis of process parameters which may be selected on the basis of the same criteria as previously explained. In this respect, it should be appreciated that material 331 is selected such that it may withstand the process conditions during the deposition of the layer 340. Hence, the material 340 may also be deposited on the material 331, which may provide a highly non-pronounced surface topography.

Figure 3B:
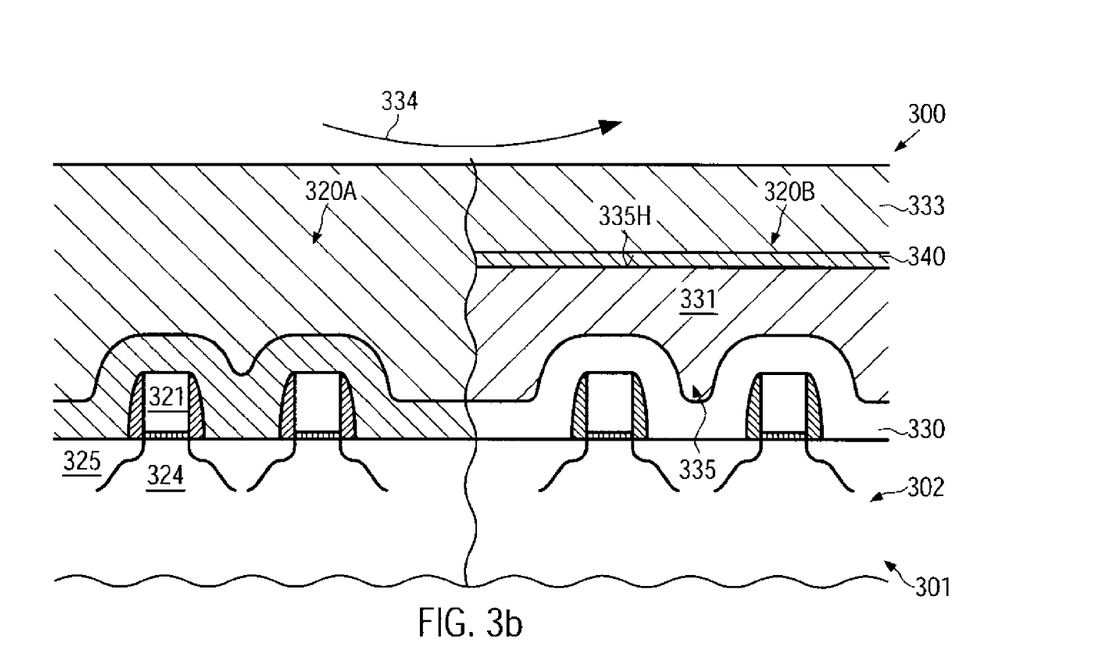

FIG. 3b schematically illustrates the semiconductor device 300 in a further advanced manufacturing stage, in which a further fill material 333 may be provided, for instance, in the form of any appropriate polymer material that may be applied by spin-coating and the like. In the embodiment shown, the fill material 333 is provided with a certain amount of excess height with respect to the device region 320A, while, in other embodiments, a similar height compared to the layer 340 in the region 320A may be provided. After the application of the fill material 333, a spatially non-selective removal process 334 may be performed, for instance, in the form of chemical mechanical polishing (CMP), etching and the like. For instance, the process 334 may comprise a CMP process, in which excess material may be removed until the layer 340 may be exposed. In some cases, a highly non-selective CMP process may be performed, thereby removing the exposed material 340 together with the material 333, wherein the removal of the layer 340 and thus the exposure of the material 331 may be used as an endpoint detection signal for the CMP process 334. Furthermore, due to the excess height provided by the fill material 331, the mechanical integrity of the layers 340 and 330 may be maintained. Thus, undue exposure of these material layers may be substantially avoided.

Figure 3C:
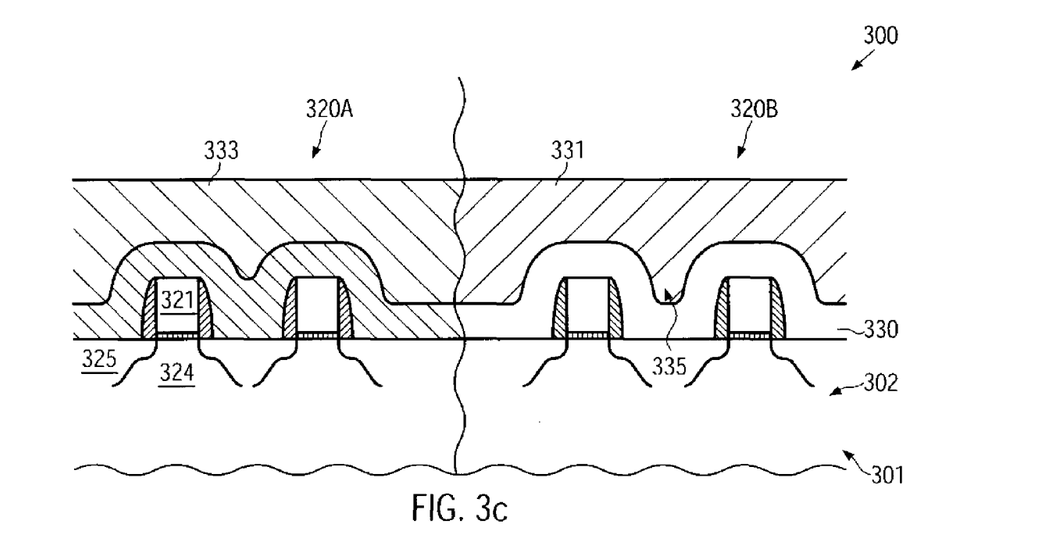

FIG. 3c schematically illustrates the semiconductor device 300 after the end of the removal process 334. Hence, a substantially planar surface topography may be obtained, wherein, in some illustrative embodiments, the materials 333, 331 may be similar or the same materials, thereby providing enhanced process uniformity during the further processing of the device 300. In some illustrative embodiments, the further processing may be continued by depositing an appropriate interlayer dielectric material directly on the materials 331, 333, while in other cases the materials 331, 333 may be removed by a selective etch process, in which the layers 330 and 340 may act as etch stop materials.

Figure 3D:
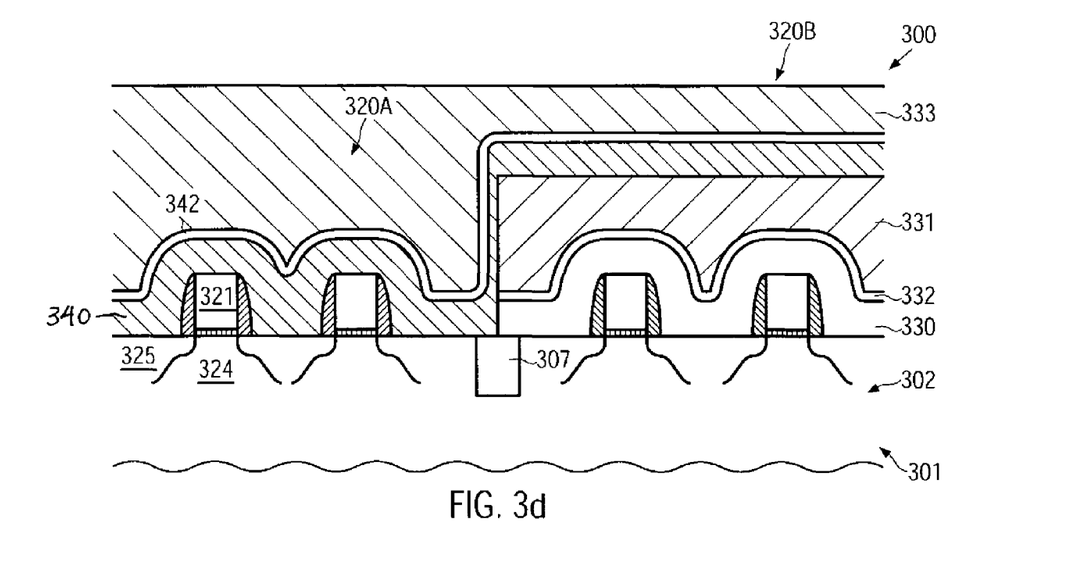

FIG. 3d schematically illustrates the device 300 according to further illustrative embodiments, in which additional etch stop layers 332 and 342 may be provided on the corresponding stress-inducing layers 330, 340, respectively. Furthermore, the fill materials 331 and 333 may be provided, as previously explained.

The device 300 may be formed on the basis of similar process techniques as previously described, wherein, additionally, after the deposition of the stress-inducing layer 330, the etch stop layer 332 may be formed on the basis of any appropriate technique, wherein a thickness thereof may be selected moderately low, as long as the integrity of the layer 330 in a later etch process may be maintained. Similarly, after the deposition of the layer 340, the etch stop layer 342 may be deposited and may, for instance, be comprised of the same material as the layer 332. Thereafter, the fill material 333 may be provided and a spatially non-selective removal process may be performed, as previously described, for instance in the form of CMP and/or etching techniques.

Furthermore, in FIG. 3d an isolation structure 307 may be provided, which may separate the device regions 320a, 320b. Thus, the material layers 340 and 342 may also be formed on vertical sidewall portions of the material 331, possibly with a reduced thickness, depending on the overall deposition characteristics. In one illustrative embodiment, a CMP process may be performed so as to first expose and remove the layer 342 and to subsequently remove for example portions of the layer 340. In other cases, after exposing the layer 340, an etch process may be performed that is selective with respect to the layer 342, while removing material of the layer 340 and of the layers 331, 333. Thus, the layer 340 may be removed also above the isolation trench 307, thereby also removing the vertical portion of the etch stop layer 342. Finally, the etch stop layers 342, 332 may reliably stop the etch process without undue material removal of the layers 330, 340.

Furthermore, in FIG. 3d, an isolation structure 307 may be provided, which may separate the device regions 320A, 320B. Thus, the material layers 340 and 342 may also be formed on vertical sidewall portions of the material 331, possibly with a reduced thickness, depending on the overall deposition characteristics. In one illustrative embodiment, a CMP process may be performed to first expose and remove the layer 342 and to subsequently remove, for example, portions of the layer 340. In other cases, after exposing the layer 340, an etch process may be performed that is selective with respect to the layer 342, while removing material of the layer 340 and of the layers 331, 333. Thus, the layer 340 may also be removed above the isolation trench 307, thereby also removing the vertical portion of the etch stop layer 342. Finally, the etch stop layers 342, 332 may reliably stop the etch process without undue material removal of the layers 330, 340.

Thereafter, the further processing may be continued by depositing an interlayer dielectric material, as previously explained. As in the case of the embodiments described with reference to FIGS. 2a-2e, an efficient smoothing of surface topography may be accomplished prior to the deposition of the second stress-inducing layer, while also avoiding a lithography step for patterning the second stress-inducing layer.

As a result, the subject matter disclosed herein provides techniques and semiconductor devices in which the surface topography may be smoothed during a dual stress liner approach for sophisticated semiconductor devices, in that an appropriate material may be provided with increased thickness after the deposition of the first stress-inducing layer on the basis of a deposition technique of enhanced gap fill capabilities. Consequently, the deposition of a subsequent stress-inducing material may be performed on the basis of a significantly less pronounced surface topography, thereby reducing the probability of creating voids and other irregularities. Thus, the stress-inducing layers may be provided with increased thickness, thereby enhancing transistor performance while not additionally contributing to deposition-related irregularities. Furthermore, the material for smoothing the surface topography may be efficiently used for controlling the selective removal of unwanted portions of the second stress-inducing layer. For instance, a silicon dioxide based etch control material may be provided with increased thickness, for instance, with a thickness of approximately 20 nm and more for sophisticated devices including transistors with a gate length of, for instance, 30 nm or less, thereby providing the smoothing effect in combination with superior etch stop capabilities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    conformally depositing a first stress-inducing dielectric layer above a first plurality of gate electrode structures and a second plurality of gate electrode structures of a semiconductor device, said first and second gate electrode structures being at least partially formed above a semiconductor layer;
    forming an etch control layer on said first stress-inducing layer using a non-conformal deposition process so as to obtain a specified fill height of said first stress-inducing layer and said etch control layer in a space between adjacent two of said gate electrode structures, said specified fill height corresponding to at least one half of a height of said first and second pluralities of gate electrode structures;
    selectively removing said etch control layer and first stress-inducing layer from above said second plurality of gate electrode structures;
    depositing a second stress-inducing dielectric layer above said etch control layer and said first stress-inducing layer and said second plurality of gate electrode structures; and
    selectively removing said second stress inducing layer from above said first stress-inducing layer by performing an etch process and using said etch control layer as an etch stop.

2. The method of claim 1, wherein conformally depositing said first stress-inducing layer comprises selecting a layer thickness to form a gap in said space, said gap having a substantially horizontally extending bottom portion.

3. The method of claim 1, wherein a gate length of said first and second pluralities of gate electrode structures is approximately 50 nm or less.

4. A method, comprising:
    depositing a first stress-inducing dielectric layer above a plurality of gate electrode structures, said plurality of gate electrode structures at least partially being formed above a semiconductor layer;

forming one or more material layers so as to fill spaces between adjacent ones of said plurality of gate electrode structures up to a height level that approximately corresponds to one half or more of a height of said plurality of gate electrode structures, wherein at least one of said one or more material layers is formed using a non-conformal deposition process;

selectively removing said one or more material layers and said first stress-inducing layer from above a second subset of said plurality of gate electrode structures while maintaining said one or more material layers and said first stress-inducing layer above a first subset of said plurality of gate electrode structures;

forming a second stress-inducing layer above said first and second subsets of gate electrode structures; and selectively removing said second stress-inducing layer from above said first subset by performing a removal process and using said one or more material layers for controlling said removal process.

5. The method of claim 4, wherein forming said first stress-inducing layer comprises conformally depositing said first stress-inducing layer.

6. The method of claim 5, wherein conformally depositing said first stress-inducing layer comprises selecting a layer thickness to form a gap in said space, said gap having a substantially horizontally extending bottom portion.

7. The method of claim 4, wherein forming said one or more material layers comprises depositing a silicon dioxide layer to fill said space.

8. The method of claim 4, wherein forming said one or more material layers comprises depositing at least one layer by spin-coating.

9. The method of claim 4, wherein said one or more material layers are formed to fill said space up to a height level that substantially corresponds to a height level of said plurality of gate electrode structures.

10. The method of claim 9, wherein said height level is higher than said height level of said plurality of gate electrode structures.

11. The method of claim 10, further comprising non-conformally depositing a fill material after forming said second stress-inducing layer and commonly removing a portion of said fill material and said second stress-inducing layer from above said first subset of gate electrode structures.

12. The method of claim 11, wherein removing a portion of said fill material and said second stress-inducing layer comprises performing a non-masked removal process.

13. The method of claim 10, wherein a first one of said one or more material layers is deposited by a conformal deposition process and a second one of said one or more material layers is deposited by a non-conformal deposition process.

14. The method of claim 4, wherein a gate length of said first and second subsets of said plurality of gate electrode structures is approximately 50 nm or less.

15. The method of claim 4, wherein said one or more material layers comprises at least an etch control layer, and selectively removing said second stress layer comprises selectively removing said second stress inducing layer from above said first stress-inducing layer by performing an etch process and using said etch control layer as an etch stop.

* * * * *